(12) United States Patent
Matsuda

(10) Patent No.: US 8,638,147 B2
(45) Date of Patent: Jan. 28, 2014

(54) CLOCK GENERATOR AND SYSTEM INCLUDING THE SAME

(71) Applicant: Fujitsu Limited, Kawasaki (JP)

(72) Inventor: Atsushi Matsuda, Akishima (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/964,584

(22) Filed: Aug. 12, 2013

(65) Prior Publication Data

US 2013/0328604 A1 Dec. 12, 2013

Related U.S. Application Data

(63) Continuation of application No. PCT/JP2011/054656, filed on Mar. 1, 2011.

(51) Int. Cl.
*H03L 7/06* (2006.01)

(52) U.S. Cl.
USPC ............................. 327/159; 327/149; 327/158

(58) Field of Classification Search
USPC ......................................... 327/149, 158, 159
See application file for complete search history.

(56) References Cited

U.S. PATENT DOCUMENTS

| 6,697,416 B1 | 2/2004 | Jennings | |
|---|---|---|---|
| 2005/0122145 A1* | 6/2005 | Ido et al. | 327/156 |
| 2009/0052508 A1 | 2/2009 | Takahashi | |
| 2009/0190694 A1 | 7/2009 | Kobayashi | |
| 2010/0164570 A1* | 7/2010 | Priego | 327/157 |
| 2010/0182060 A1 | 7/2010 | Fujino et al. | |
| 2010/0253402 A1* | 10/2010 | Awata | 327/156 |
| 2011/0204940 A1* | 8/2011 | Kanda | 327/157 |
| 2011/0228889 A1* | 9/2011 | Liu et al. | 375/376 |
| 2012/0112809 A1* | 5/2012 | Zhu et al. | 327/157 |
| 2013/0076414 A1* | 3/2013 | Kato | 327/157 |
| 2013/0093478 A1* | 4/2013 | Wong | 327/156 |
| 2013/0120037 A1* | 5/2013 | Tripathi et al. | 327/156 |
| 2013/0127505 A1* | 5/2013 | Kanda | 327/157 |
| 2013/0241600 A1* | 9/2013 | Da Dalt et al. | 327/105 |

FOREIGN PATENT DOCUMENTS

| JP | 2001-331236 A | 11/2001 |
|---|---|---|
| JP | 2009-21954 A | 1/2009 |
| JP | 2009-177685 A | 8/2009 |
| JP | 2010-166392 A | 7/2010 |

OTHER PUBLICATIONS

Search Report issued in International Patent Application No. PCT/JP2011/054656, mailed May 24, 2011, 2 pages.
Staszewski et al., "Software Assisted Digital RF Processor (DRPTM) for Single-Chip GSM Radio in 90 nm CMOS," IEEE Journal of Solid-State Circuits, vol. 45, No. 2, Feb. 2010, 13 pages.

* cited by examiner

*Primary Examiner* — Adam Houston
(74) *Attorney, Agent, or Firm* — Arent Fox LLP

(57) ABSTRACT

A clock generator includes a digitally controlled oscillator configured to generate an output clock having a frequency depending on an input code; a phase comparison section configured to output a phase difference signal by comparing a reference phase with a phase of the output clock, the reference phase being based on an input clock and a predetermined frequency multiplication number; a low-pass filter configured to provide the input code for the digitally controlled oscillator by filtering the phase difference signal; a waveform generating section configured to generate a predetermined spread spectrum wave, the predetermined spread spectrum wave being to be added with both of the frequency multiplication number and the input code; and a detection/compensation section configured to compensate the input code so that the phase difference is reduced, the phase difference being detected from the phase difference signal.

16 Claims, 17 Drawing Sheets

CLOCK GENERATOR AND SYSTEM INCLUDING THE SAME

CROSS-REFERENCE TO RELATED APPLICATIONS

This application is a continuation application of International Application PCT/JP2011/054656 filed on Mar. 1, 2011 and designated the U.S., the entire contents of which are incorporated herein by reference.

FIELD

The present invention related to a clock generator, and a system including the clock generator.

BACKGROUND

As semiconductor devices have evolved to have high performance and to become highly integrated, development of what is called "All Digital Phase-Locked Loop (ADPLL)" progresses, which is a phase synchronization circuit configured with a digital circuit as a whole. Compared with a conventional analog PLL circuit, an ADPLL circuit has, for example, advantages such as low-voltage operation, compatibility with fine process, and the like. An ADPLL circuit can be used for, for example, a frequency synthesizer for a wireless communication circuit as well as a clock generator for an arithmetic circuit or an interface circuit.

A clock generator in general generates a faster clock from an input clock that has a reference frequency $F_{REF}$. In a clock generator based on an ADPLL circuit, this multiplication number is given by a digital input value called a "Frequency Command Word (FCW)" or the like. Therefore, if a given input clock and an FCW are input, an output clock has, as illustrated in FIG. 1, a time-invariant frequency $F_{REF}*FCW$ (FIG. 1A), and an acute electric field peak at that frequency (FIG. 1B). However, such an output spectrum peak generates unnecessary electromagnetic interference (EMI) from a circuit and/or an electronic device including the clock generator. As EMI exerts an influence on peripheral devices, it is restricted by various standards. For example, EMI is often restricted for various interface circuits that execute high-speed data exchange between devices.

As a technology that can suppress EMI, a spread spectrum clock generator (SSCG) is known. An SSCG can suppress an electric field peak, as illustrated in FIGS. 2A-2B, by slightly fluctuating the frequency of an output clock to oscillate for spreading the output spectrum (FIG. 2A), with the same total power (FIG. 2B). Here, in FIG. 2B, an electric field curve without spread spectrum illustrated in FIG. 1B is illustrated with a dashed line for comparison. Therefore, unnecessary radiation from a circuit and/or an electronic device including an SSCG can be suppressed, which in turn can suppress or avoid an adverse influence to peripheral devices and the like.

An SSCG fluctuates an output frequency, in general, with a triangular waveform as illustrated in FIG. 2A to obtain a flatter output spectrum waveform. A value obtained with the spread width $\Delta F_{out}$ (peak-to-peak value) of an output frequency divided by the reference value ($F_{REF}*FCW$) of the output frequency is called a spread ration, and the frequency of a triangular wave is called a spread frequency $F_{SS}$. For example, a spread ratio can be set to 0.5% to 5%, and a spread frequency can be set to several kHz to several hundred kHz. Here, in FIG. 2A, a case of what is called a "down-spread" method is illustrated that sets $F_{REF}*FCW$ as a maximum value of the output frequency having a triangular waveform. Alternatively, what is called a "center-spread" method may be used that sets $F_{REF}*FCW$ as a center value of the output frequency.

An ADPLL circuit typically includes a phase comparison circuit, a low-pass filter, also called as a loop filter, and a digitally controlled oscillator (DCO). In addition to theses ADPLL circuit configuration elements, an SSCG based on ADPLL includes a triangular wave generating circuit for spectrum spreading, and can be classified into two methods depending on a connect position of the triangular wave generating circuit. A first method adds the triangular wave to the frequency command word (multiplication number setting value) FCW input to a phase comparison circuit, and a second method adds the triangular wave to the output of the loop filter that becomes the input code for the DCO.

In the first method, the triangular wave is directly added to the frequency command word, hence it is possible to achieve a desired spread ration (even if gain compensation of the DCO is incomplete, which will be described later). However, the spread frequency needs to be contained in a band of the closed loop function (low-pass characteristic) of a PLL circuit between the triangular wave is added to the input of the PLL circuit, and phase information including a triangular wave component needs to be transmitted to the DCO via the loop filter. If the spread frequency is set outside of the band, the triangular wave attenuates. On the contrary, in the second method, the spread frequency needs to be set outside of the band of the closed loop function of the PLL circuit. From the DCO input viewpoint, the transfer function has a high-pass characteristic, with which the triangular wave attenuates if the spread frequency is set in the band of the closed loop function. In the following, for the sake of explanation, SSCGs according to the first and second methods above will be referred to as a "slow SSCG" and a "fast SSCG", respectively, based on the spread frequency range that can be set.

FIG. 3 schematically illustrates the Spread frequency range that can be set with a slow SSCG and a fast SSCG. fc is the cutoff frequency of the closed loop function of a PLL circuit. The cutoff frequency fc has a restriction, which usually makes it be set to under 1/10 of the input clock frequency $F_{REF}$, for example, between 1/100 and 1/10. If the spread frequency is close to fc, waveform distortion may occur, hence the spread frequency in the slow SSCG is restricted within a frequency range that is further lower than fc. In contrast, it is possible for the fast SSCG to spread a spectrum at a comparatively high frequency. A high spread frequency can reduce data amount that needs to be buffered between a circuit that operates with a clock generator without using a spread spectrum and a circuit that operates using an SSCG. Therefore, a fast SSCG is often required for various circuits such as various interface circuits and the like.

However, the following problem may arise with a typical fast SSCG in which the triangular wave is added to an input code for a DCO. A DCO outputs a clock with an oscillation frequency that corresponds to the digital input code, and usually sets a frequency change amount per input code $\Delta f$ to a desired value fd ($\Delta f=fd[Hz/one\ code]$). This slope of the DCO is called gain or KDCO as well. As KDCO varies with an element variation of semiconductor manufacturing, a multiplier is placed at the DCO input to multiply a gain compensation coefficient cor_GAIN to make $\Delta f=cor\_GAIN*KDCO=fd[Hz/1code]$. If the gain compensation coefficient cor_GAIN is not appropriate, for example, if KDCO after compensation deviates 20 to 30%, it is not a major problem with a usual PLL although a closed-loop characteristic may deviate a bit. However, with a fast SSCG, a deviation for cor_GAIN directly lead to a deviation of the spread ration.

FIG. 4 schematically illustrates a generation of spread ration deviation caused by such deviation of cor_GAIN. Assuming that a required value of cor_GAIN is k, and if it is exactly that cor_GAIN=k, the frequency increment amount per code becomes Δf=fd. If the target value of the spread ratio is 5%, the actually obtained spread ratio becomes 5%. However, for example, if it is set that cor_GAIN=0.8*k, the frequency increment amount per code becomes Δf=0.8*fd. If the target value of the spread ratio is 5%, the actually obtained spread ratio becomes 5*0.8=4%, which deviates from the target value. Of course, if it is set that cor_GAIN>k, a spread ratio over the target value is obtained.

Such deviation of the spread ratio from the target value changes a reduction amount of the electric field peak illustrated in FIG. 2B. Especially, if an actual spread ratio is smaller than the target value, there may be cases in which a desired EMI suppressing effect is not obtained. Also, especially, with the down-spread method of spectrum spreading, if an actual spread ratio is greater than the target value, an unexpected situation may arise in which the maximum clock frequency exceeds $F_{REF}$*FCW. An excessive clock frequency may be a cause for collapse of timing design of a digital circuit including such an SSCG.

[Related-Art Documents]
[Patent Documents]

[Patent Document 1] Japanese Laid-open Patent Publication No. 2009-177685

[Patent Document 2] Japanese Laid-open Patent Publication No. 2009-21954

SUMMARY

According to an aspect of the present invention, a clock generator includes: a digitally controlled oscillator, a phase comparison section, a low-pass filter, and a waveform generating section configured to generate a predetermined spread spectrum wave. The digitally controlled oscillator generates an output clock with a frequency depending on an input code, and the phase comparison section compares a reference phase and an output clock phase based on the input clock and a predetermined frequency multiplication number to output a phase difference signal. The low-pass filter filters the phase difference signal to provide the input code for the digitally controlled oscillator. A spread spectrum wave generated by the waveform generating section is added to both of the frequency multiplication number and the input code for the digitally controlled oscillator. The clock generator further includes a detection/compensation section for detecting a phase difference from the phase difference signal and for compensating the input code for the digitally controlled oscillator so that the phase difference is reduced.

According to another aspect of the present invention, a system includes a processor, and an interface circuit including the clock generator.

The object and advantages of the embodiment will be realized and attained by means of the elements and combinations particularly pointed out in the claims. It is to be understood that both the foregoing general description and the following detailed description are exemplary and explanatory and are not restrictive of the invention as claimed.

DESCRIPTION OF EMBODIMENTS

Figure 1A:
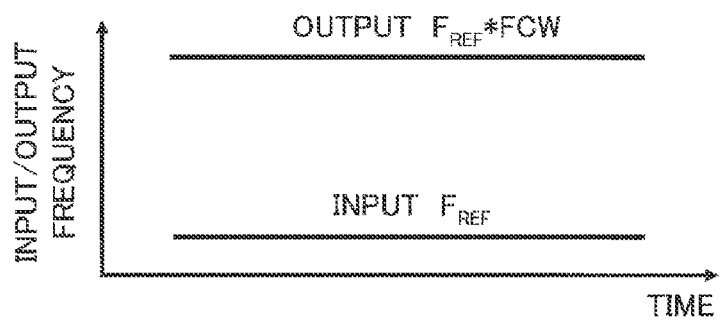
FIGS. 1A-1B are schematic views illustrating output frequency characteristics of a non-spread-spectrum-type clock generator.
Figure 1B:
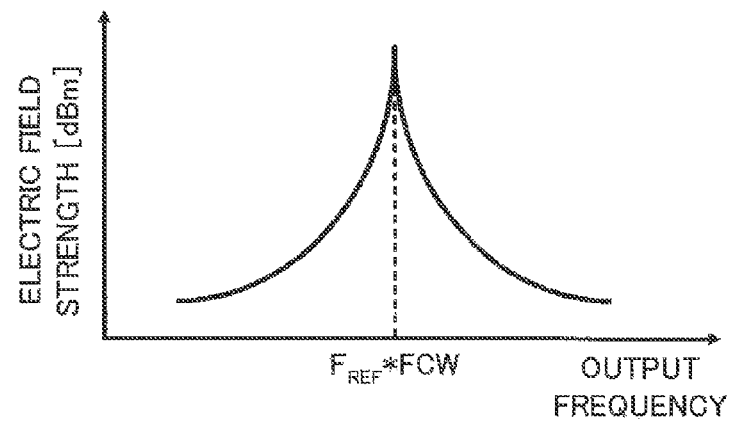
Figure 2A:
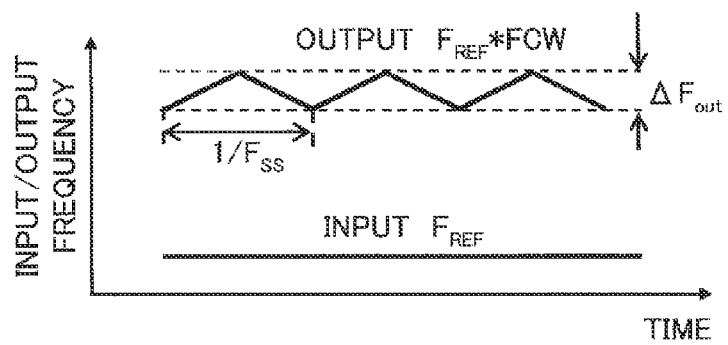
FIGS. 2A-2B are schematic view illustrating output frequency characteristics of a spread spectrum clock generator (SSCG)
Figure 2B:
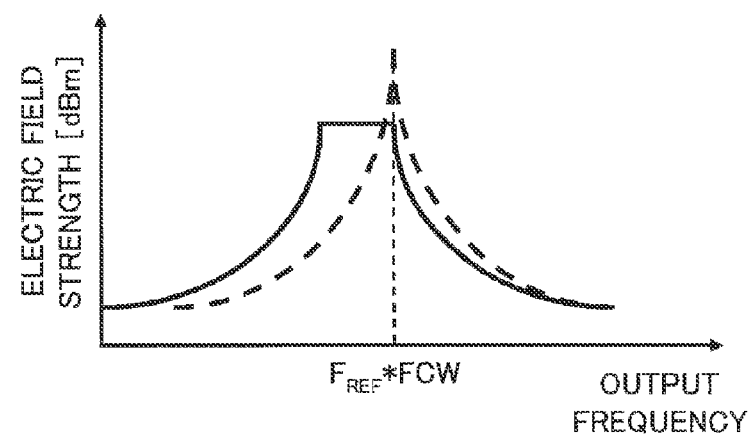
Figure 3:
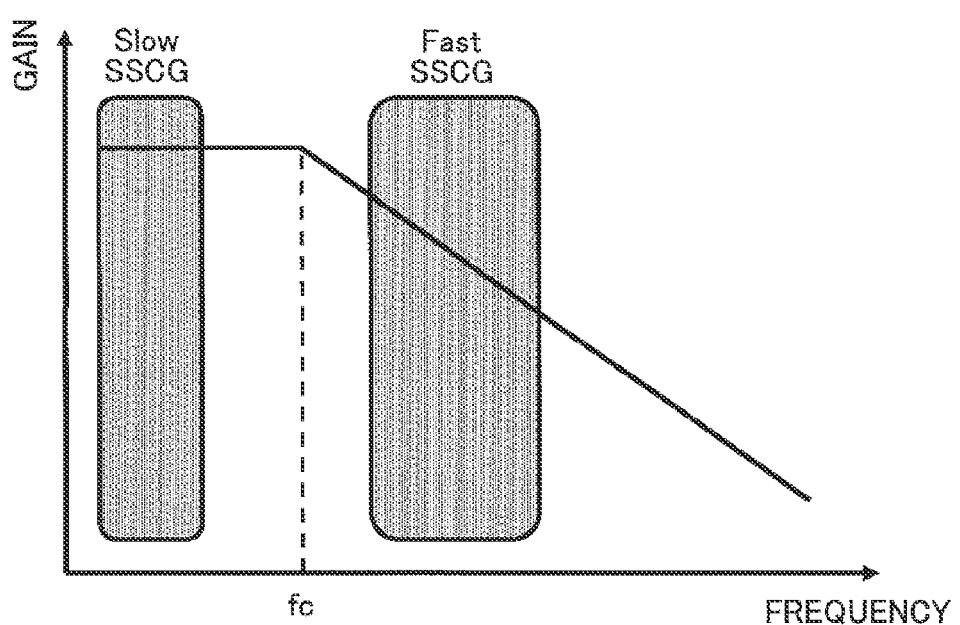
FIG. 3 is a schematic view illustrating ranges of spread frequencies that can be set with a slow SSCG and a fast SSCG, respectively.
Figure 4:
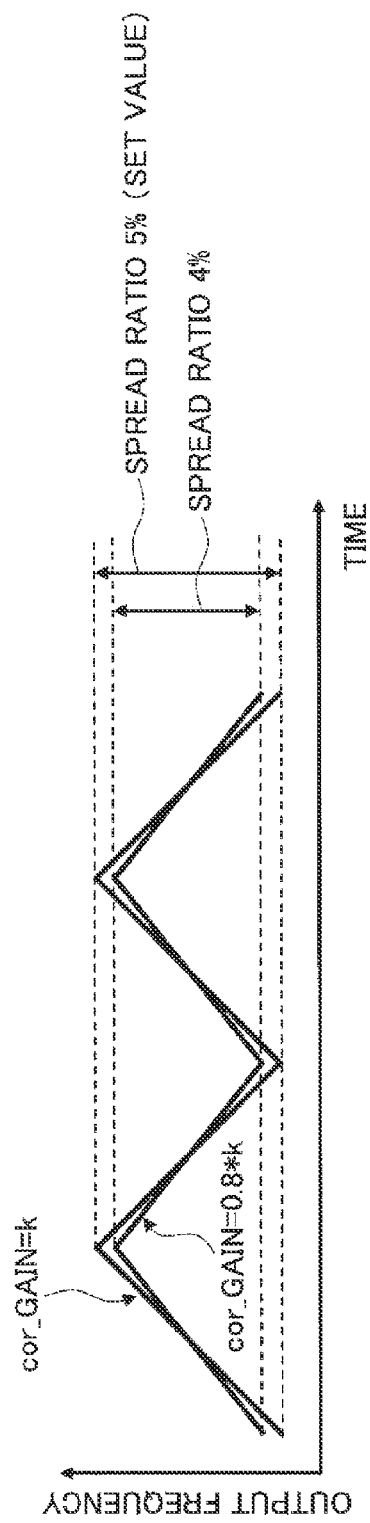
FIG. 4 is a schematic view illustrating a problem with a fast SSCG.

A spread spectrum clock generator (SSCG) is provided, in which the spread frequency can be set without being restricted by a cutoff frequency of a PLL circuit including a low-pass filter, and a desired spread ratio can be achieved. Therefore, it is possible to achieve a desired EMI suppressing effect in a system including an SSCG more securely.

In the following, embodiments will be described in detail with reference to the drawings. Here, the same or similar numeral codes are assigned to the same or corresponding configuration elements throughout multiple figures in the drawings.

First, with reference to FIGS. 5 and 6, typical examples of circuit configurations of a slow SSCG and a fast SSCG will be described, which may contribute to understanding SSCGs more sufficiently according to the present embodiment.

Figure 5:
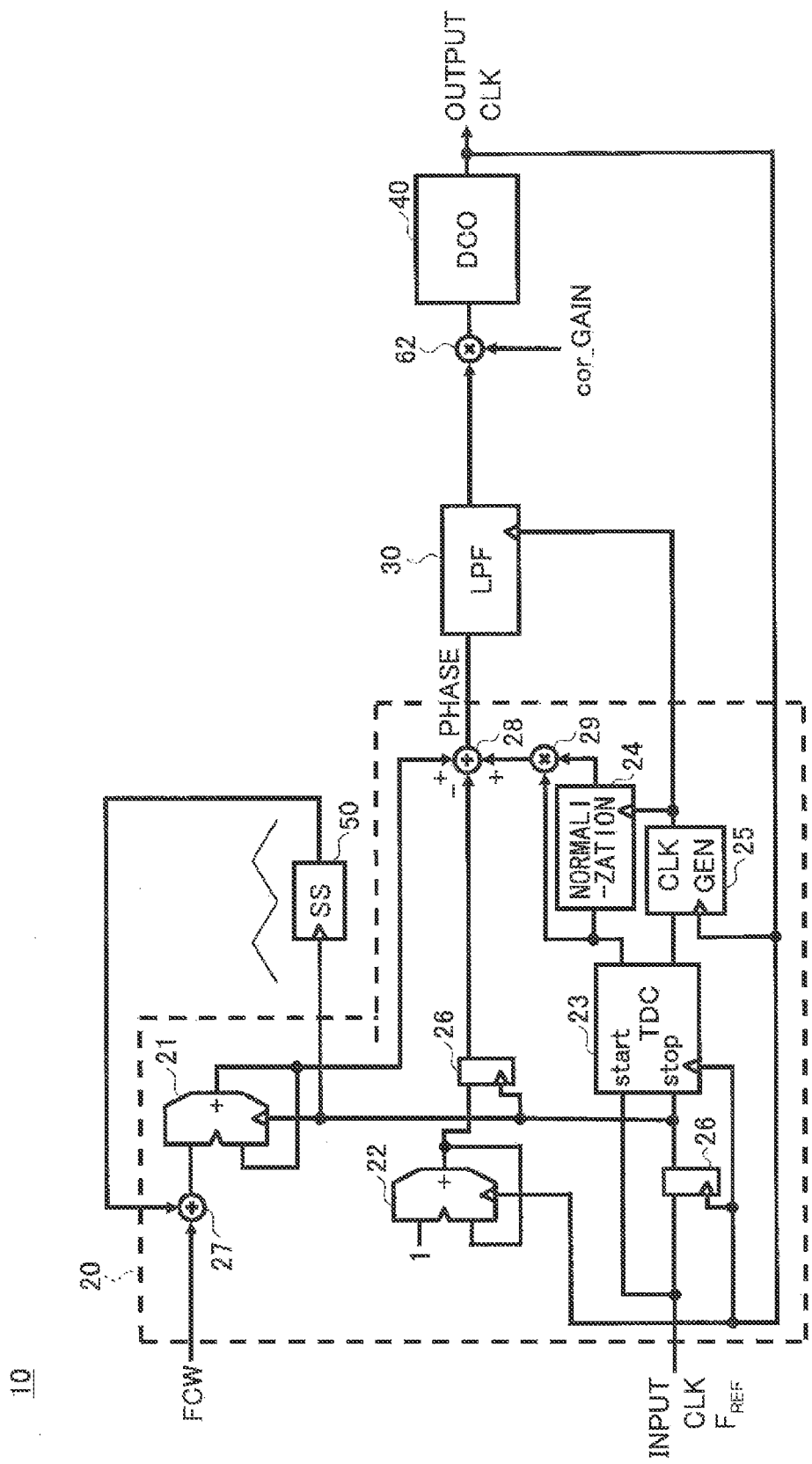
FIG. 5 is a circuit diagram illustrating a typical example of a slow SSCG.

Referring to FIG. 5, a slow SSCG 10 generally includes a phase comparison circuit 20, a low-pass filter (LPF) 30, a digitally controlled oscillator (DCO) 40, and a spread wave generating circuit (SS) 50. A low-pass filter 30 is also called a loop filter. The phase comparison circuit 20 includes counters 21 and 22, a time-to-digital converter (TDC) 23, a normalization section 24, a retiming clock generator 25, a flip-flop 26, adders 27 and 28, and a multiplier 29. The phase comparison circuit 20 receives from outside a frequency command word (multiplication number setting value) FCW and an input (reference) clock (frequency $F_{REF}$). The phase comparison circuit 20 further receives an output clock fed back from the DCO 40, and a spread spectrum wave generated by the spread wave generating circuit 50. The spread spectrum wave is preferably a triangular wave, and the spread wave is assumed to be a triangular wave in the following description.

In the slow SSCG 10, the frequency command word FCW is directly modulated with the triangular wave a the first adder 27. Therefore, the first counter 21 receives the FCW that has been added with the triangular wave from the triangular wave generating circuit 50, and outputs a reference phase signal corresponding to phase information of a target output clock. The second counter 22 and the TDC 23 collaborate to receive the output cock fed back from the DCO 40, and to output a phase signal corresponding to phase information (integer count and fraction count) of the output clock. The phase comparison circuit 20 generates a phase difference signal PHASE by calculating a difference between the two phase signals with the second adder 28, to provide the signal for the loop filter 30.

The loop filter 30 has a low-pass characteristic, and filters the phase difference signal PHASE from the phase comparison circuit 20 to provide an input code for the DCO 40.

The DCO 40 has gain KDCO that represents a frequency change amount per input code, and oscillates at a frequency depending on an input code. However, the DCO 40 has an individual difference on the KDCO value in general as described above, due to semiconductor manufacturing variation and the like. Therefore, the phase difference signal PHASE from the loop filter 30 is multiplied by a gain compensation coefficient cor_GAIN at a multiplier 62 that is inserted between the loop filter 30 and the DCO 40 to make the frequency change amount per input code $\Delta f$ be a predetermined value fd. Namely, if a proper cor_GAIN is selected, it becomes that $\Delta f$=cor_GAIN*KDCO=fd[Hz/code].

In the slow SSCG 10, the frequency of the triangular wave, namely, the spread frequency is set contained within a band of the closed loop function (low-pass characteristic) of the PLL circuit. Then, a DC component corresponding to the FCW and a triangular wave component are provided to the DCO 40 via the low-pass filter 30 and the multiplier 62 for gain compensation, to generate the output clock with a spread spectrum.

Figure 6:
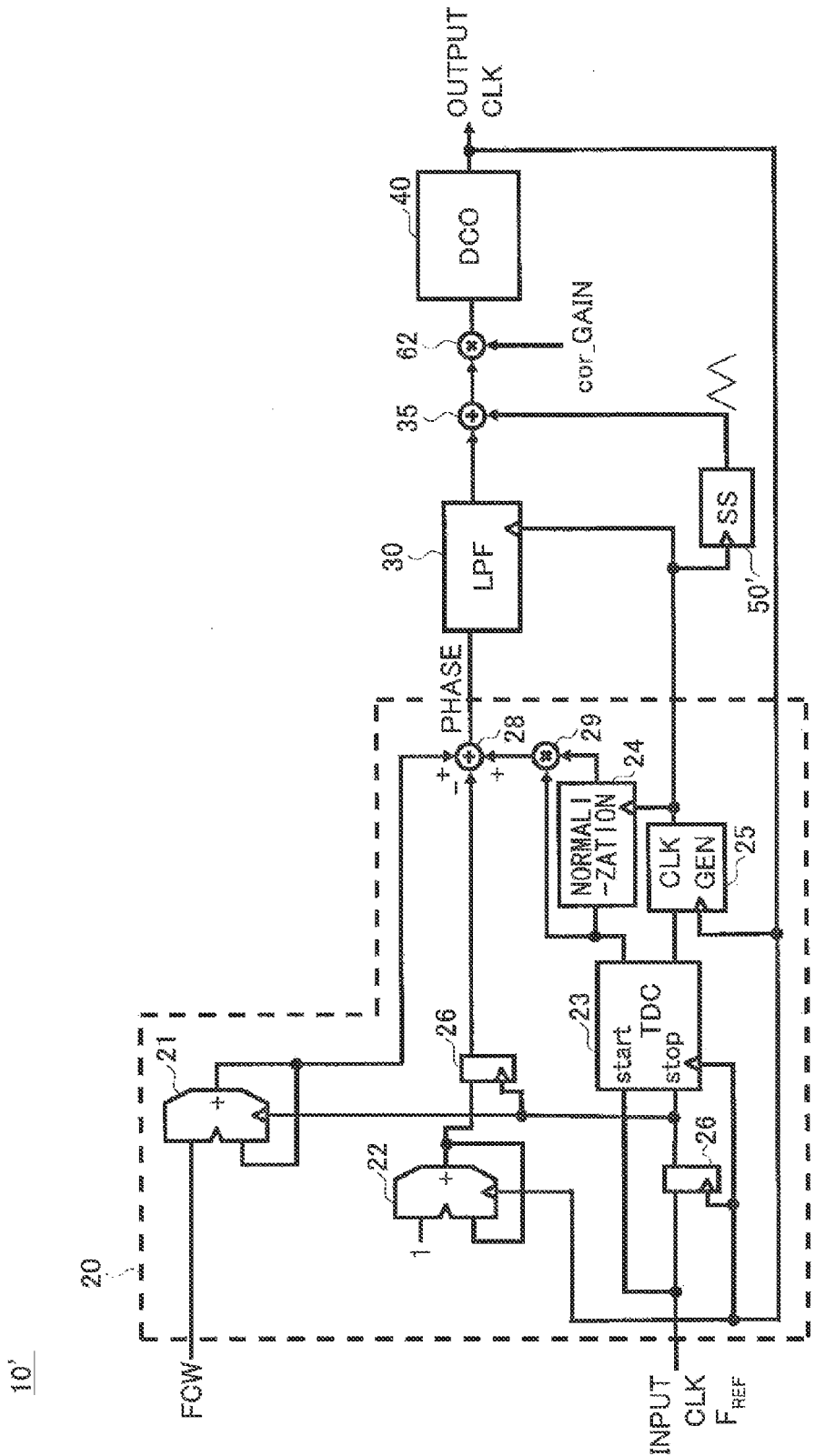
FIG. 6 is a circuit diagram illustrating a typical example of a fast SSCG.

Referring to FIG. 6, a fast SSCG 10' has a generally similar configuration as the slow SSCG 10 in FIG. 5. However, the fast SSCG 10' has a spread wave generating circuit (SS) 50' connected to an adder 35 inserted between the loop filter 30 and the DCO 40, instead of the spread wave generating circuit (SS) 50. Therefore, in the fast SSCG 10', the input code for the DCO 40 is modulated with the triangular wave.

In the fast SSCG 10', the frequency of the triangular wave, namely, the spread frequency is set outside of the band of the closed loop function (low-pass characteristic) of the PLL circuit. Then, a DC component corresponding to the FCW that has passed the low-pass filter 30 and a triangular wave component from the triangular wave generating circuit 50' are provided to the DCO 40 via the adder 35 and the multiplier 62 for gain compensation to generate the output clock with a spread spectrum.

Next, with reference to FIG. 7, an example of a circuit configuration of an SSCG will be described according to an embodiment of the present invention. An SSCG 100 illustrated in FIG. 7 has a number of same circuit elements as the SSCGs 10 and 10' illustrated in FIGS. 5-6. For those same circuit elements, numeral codes that have the common last two figures are assigned.

The SSCG 100 generally includes a phase comparison circuit 120, a low-pass filter (LPF) 130, also called a loop filter, a digitally controlled oscillator (DCO) 140, and a spread wave generating circuit (SS) 150.

The phase comparison circuit 120 includes counters 121 and 122, a time-to-digital converter (TDC) 123, a normalization section 124, a retiming clock generator 125, a flip-flop 126, adders 127 and 128, and a multiplier 129. However, a concrete circuit configuration of a phase comparison circuit according to the present embodiment is not limited to the one illustrated in FIG. 7, but circuit configurations of other phase comparison circuits that can be used in an ADPLL circuit may be used.

The phase comparison circuit 120 receives (multiplication number setting value) FCW and an input (reference) clock (frequency $F_{REF}$). The phase comparison circuit 120 further receives an output clock fed back from the DCO 140, and a spread spectrum wave generated by the spread wave generating circuit 150. The spread spectrum wave is preferably a triangular wave, with which a flatter output spectrum waveform, and further, a more sufficient EMI suppressing effect can be obtained, and the spread wave is assumed to be a triangular wave in the following description. However, other waveforms, for example, a sine wave may be used as a spread wave.

In the SSCG 100, the frequency command word FCW is directly modulated with the triangular wave from the spread wave generating circuit 150 at the first adder 127. Therefore, the first counter 121 receives the FCW that has been added with the triangular wave, and outputs a reference phase signal corresponding to phase information of a target output clock. The second counter 122 and the TDC 123 collaborate to receive the output clock fed back from the DCO 140, and to output a phase signal corresponding to phase information of the output clock. The phase comparison circuit 120 generates a phase difference signal PHASE by calculating a difference between the two phase signals by the second adder 128, to provide the signal for the loop filter 30 and a detection/compensation circuit 160.

The loop filter 130 has a low-pass characteristic, and filters the phase difference signal PHASE from the phase comparison circuit 120 to provide it for the DCO 140.

The DCO 140 oscillates at a frequency depending on an input code, and generates the output clock. The gain KDCO of the DCO 140 has an individual difference as described above, hence a multiplier 162 is provided at the input of the DCO 140 fro applying the gain compensation coefficient cor_GAIN. Also, the phase difference signal PHASE from the loop filter 130 is added with the triangular wave from the spread wave generating circuit 150 via the adder 135. This triangular wave is the same triangular wave that is input to the first adder 127 of the phase comparison section 120 in the example illustrated in FIG. 7, and has an amplitude corresponding to a desired spread ratio. The adder 135 may be inserted between the loop filter 130 and the multiplier 162.

Thus, according to the present embodiment, the triangular waves for spectrum spreading are added to both of the frequency command word FCW in the phase comparison circuit 120 and the input code for the DCO 140. Both triangular waves may have different amplitudes from each other as long as the phases are the same. However, the triangular wave added to the FCW at the adder 127 needs to have an amplitude corresponding to the desired spread ratio. This is because the FCW and the triangular wave added to the adder 127 gives a reference phase to which the output clock should be aligned.

Figure 7:
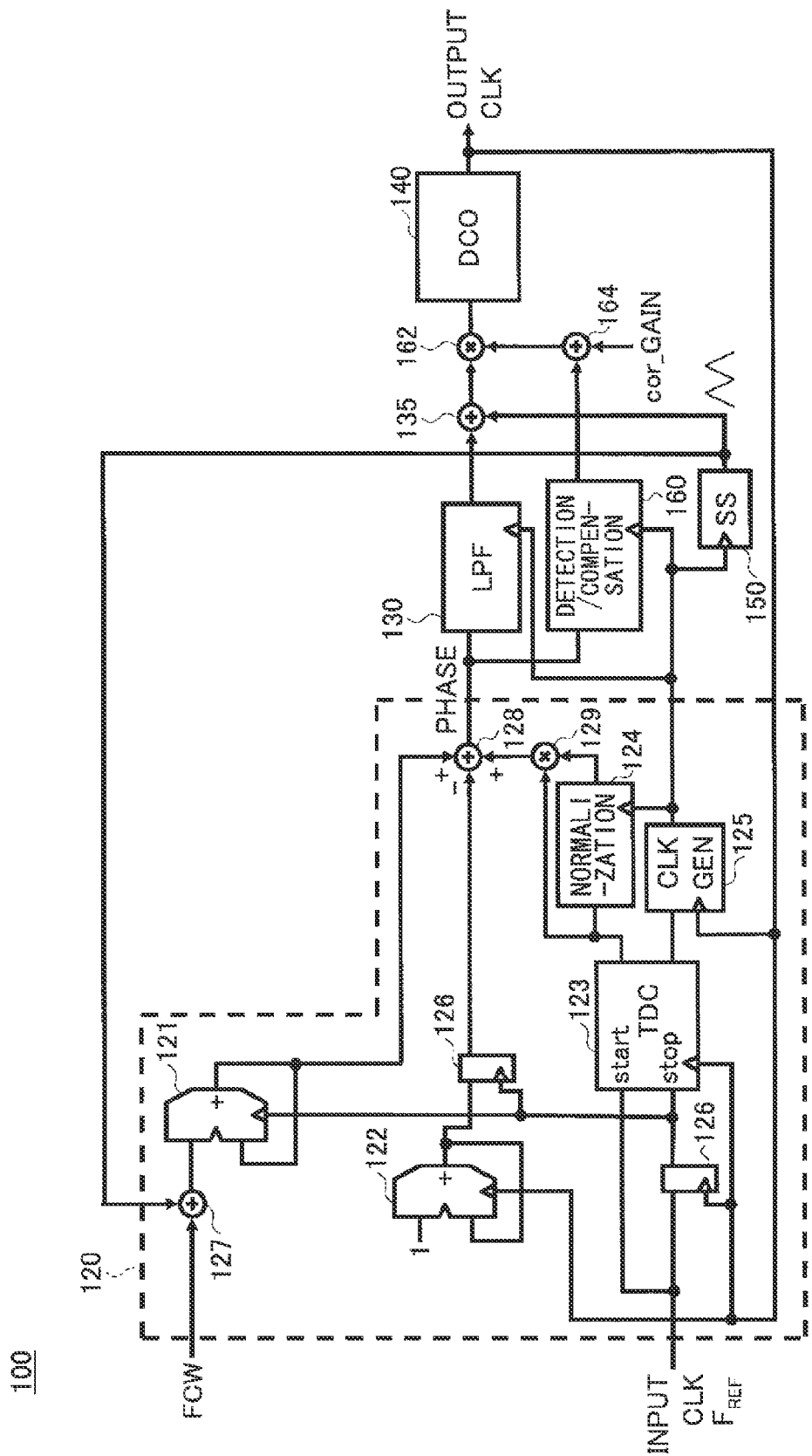
FIG. 7 is a circuit diagram illustrating an SSCG according to an embodiment.

In the example in FIG. 7, the same triangular waves are added to both of the FCW and the input code for the DCO 140. However, the triangular wave actually input to the DCO 140 is the one multiplied by the gain (KDCO) compensation coefficient cor_GAIN at the multiplier 162. Assuming that KDCO compensation coefficient cor_GAIN is set correctly, the triangular wave is canceled with the phase difference signal PHASE output from the phase comparison circuit 120. Namely, if, on the contrary, the triangular wave remains in the phase difference signal PHASE, it implies that the KDCO compensation coefficient cor_GAIN is not set correctly.

Therefore, the SSCG 100 further includes the detection/compensation circuit 160 that detects a remaining spread wave (for example, a triangular wave) in the phase difference signal PHASE from the phase comparison circuit 120 to compensate the KDCO compensation coefficient. The compensate/detection circuit 160 compensates cor_GAIN to obtain a KDCO compensation coefficient cor_GAIN' that makes the frequency change amount per input code Δf be the predetermined value fd (namely, Δf=cor_GAIN'*KDCO=fd [Hz/code]). The KDCO compensation coefficient cor_GAIN before compensation may be compensated via a certain arithmetic unit, for example, the adder 164 as illustrated in FIG. 7.

Figure 8:
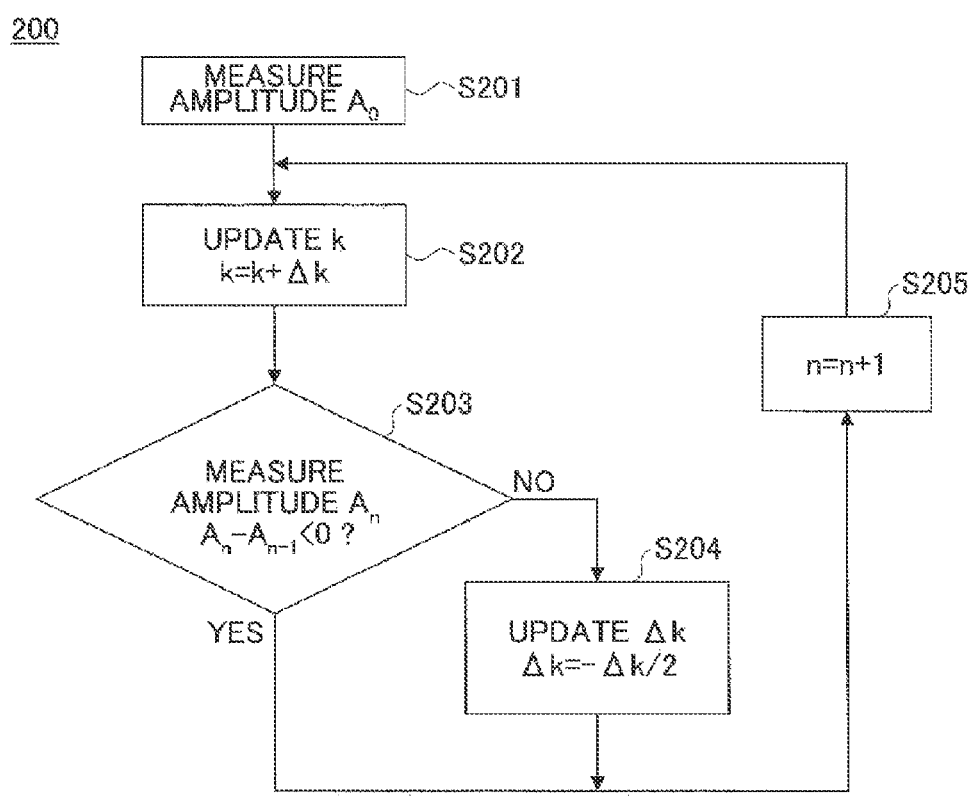
FIG. 8 is a flowchart illustrating an example of a compensation algorithm of a gain compensation coefficient.

FIG. 8 illustrates an example of a residual spread wave detection/gain compensation algorithm 200 that may be used in the detect/compensation circuit 160. First, the initial amplitude $A_0$ of the phase difference signal PHASE from the loop filter 130 is measured (S201). Next, the initial value of cor_GAIN is added with a predetermined initial compensation amount Δk (S202). Here, in FIG. 8, cor_GAIN is designated as k. The initial value of cor_GAIN may be selected in various ways because cor_GAIN is to be updated gradually to a required value (expected value) cor_GAIN' following the algorithm 200. For example, the initial value of cor_GAIN may be selected as a sufficiently smaller value than an expected value so that the output clock with a spread spectrum will not exceed a maximum permissible frequency (for example, $F_{REF}$*FCW in the down-spread method). For another example, the initial value of cor_GAIN may be selected close to the expected value to accelerate its convergence to the expected value.

Then, after a certain length of wait time, the amplitude $A_1$ (corresponds to n=1) of the phase difference signal PHASE is measured again to determine whether it is reduced from the previous amplitude $A_0$ (S203). If the amplitude is reduced, for example, the processing with this value of cor_GAIN is terminated without updating the value of Δk (S205), and the procedure goes back to Step S202. For another example, the value of Δk may be increased or decreased depending on the magnitude of measured amplitude. If it is determined that the amplitude is not reduced at Step S203, the compensation amount Δk is updated (S204), then the processing with this value of cor_GAIN is terminated (S205), and the procedure goes back to Step S202. Update of the compensation amount Δk at Step S204 may be executed, for example, by replacing Δk with −Δk/2. This replacement may be easily executed with a shift operation of a register that stores the value of Δk.

Then, by iterating Steps S202 to S205 for n≥2 to make the amplitude of the phase difference signal PHASE reach zero asymptotically, cor_GAIN can be brought to the expected value cor_GAIN'. Therefore, by using the residual spread wave detection/gain compensation algorithm 200, the gain KDCO of the DCO 140 can be compensated with high precision to obtain a desired spread ratio that has the target value.

Here, this iteration of Steps S202 to S205 may be executed at a longer cycle than the cycle corresponding to the band of the PLL circuit. For example, this iteration frequency may be set to about 1/10 of the cutoff frequency fc of the closed loop function. For example, if the cutoff frequency fc is about 1/100 to 1/10 of the frequency $F_{REF}$ of the input clock, this iteration frequency may be 1/1000 to 1/100 of the frequency $F_{REF}$. An iteration frequency within this range makes it possible to avoid interference with operations of the PLL circuit and to achieve a convergence speed sufficient enough for practical use. The wait time for amplitude measurement at Step S203 may be determined by the iteration frequency.

Figure 9:
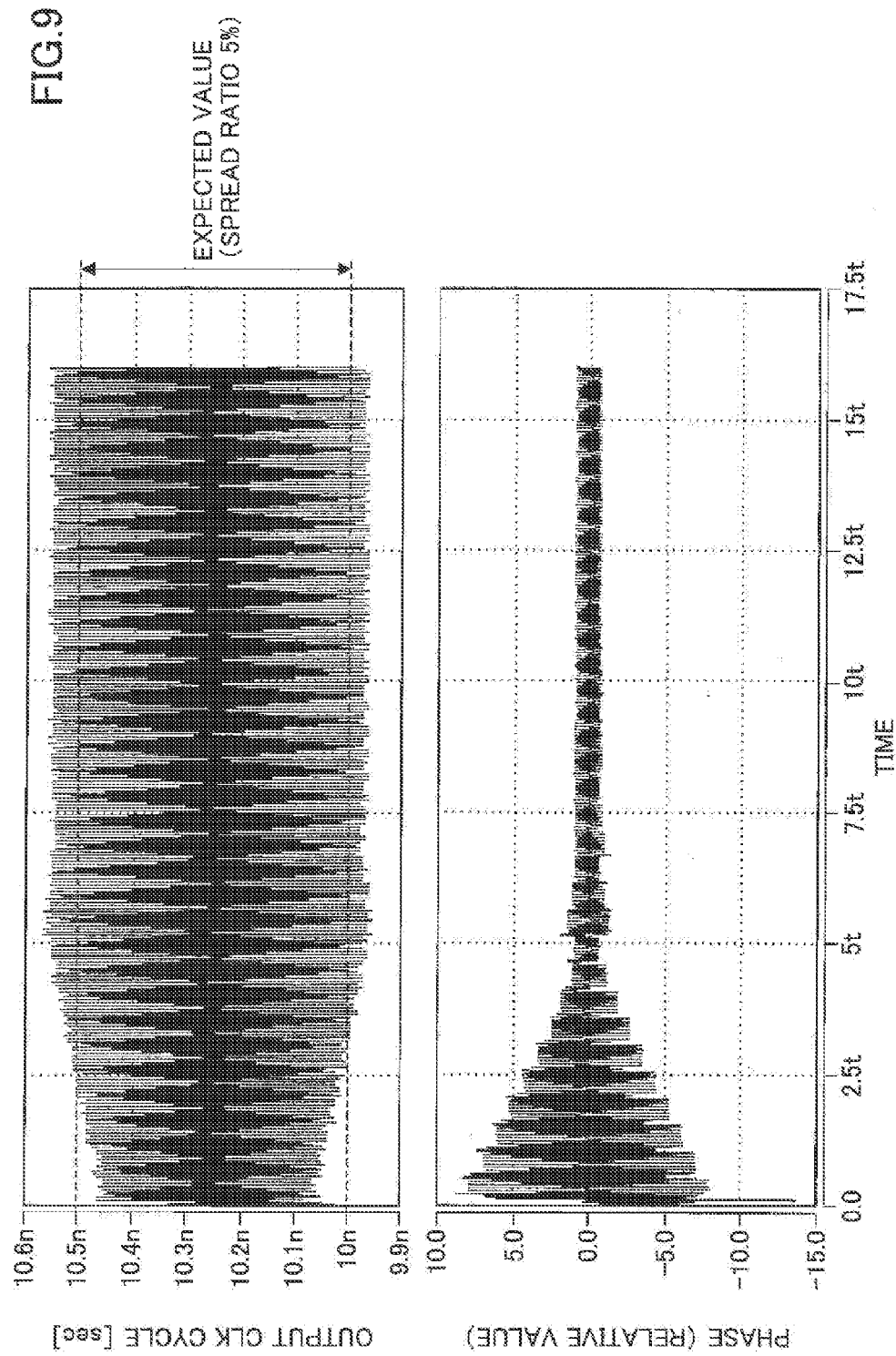
FIG. 9 is a schematic view illustrating an example of a simulation waveform applied with the algorithm in FIG. 8.
Figure 10:
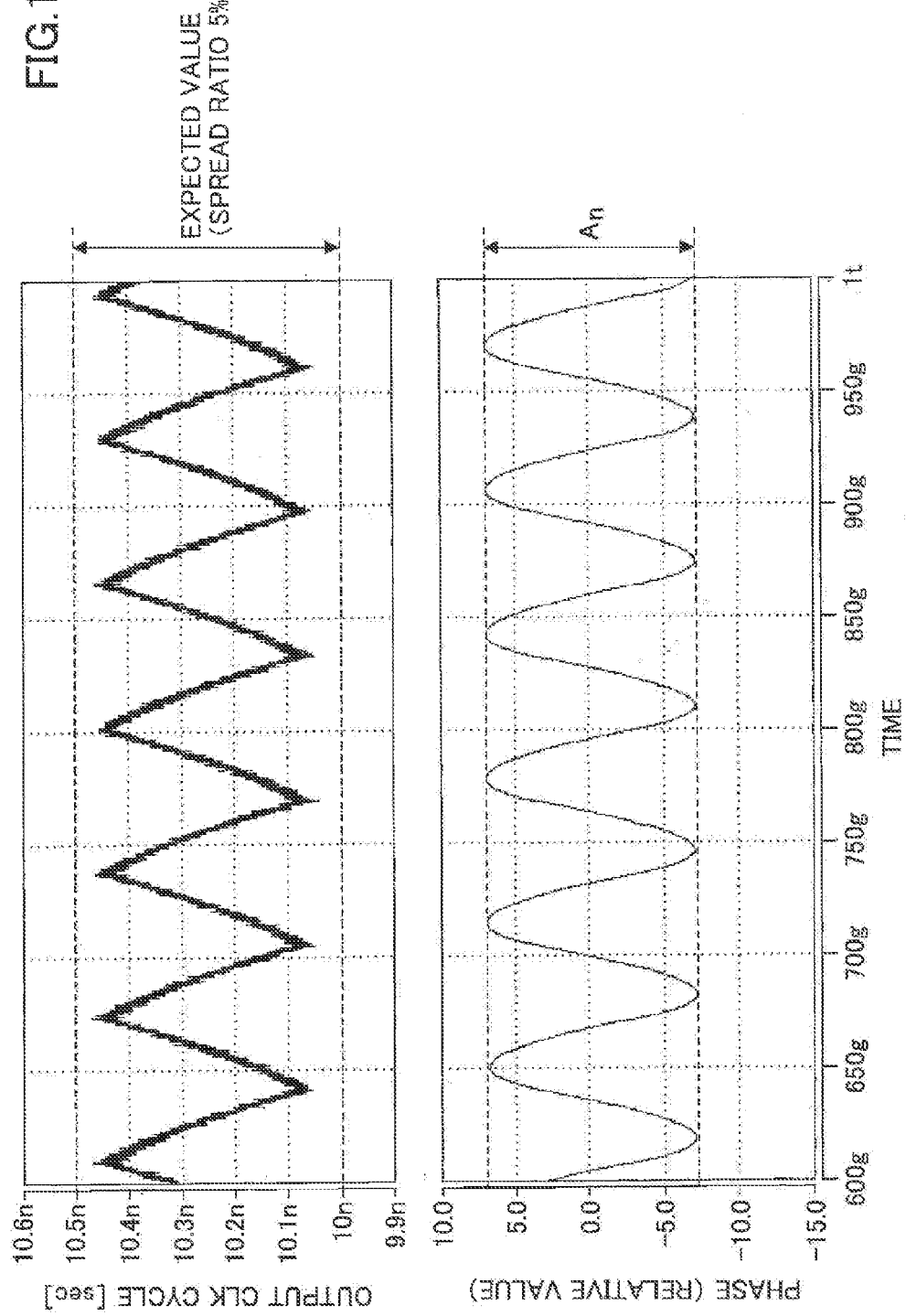
FIG. 10 is a schematic view illustrating an enlarged part of the waveform in FIG. 9 before convergence.
Figure 11:
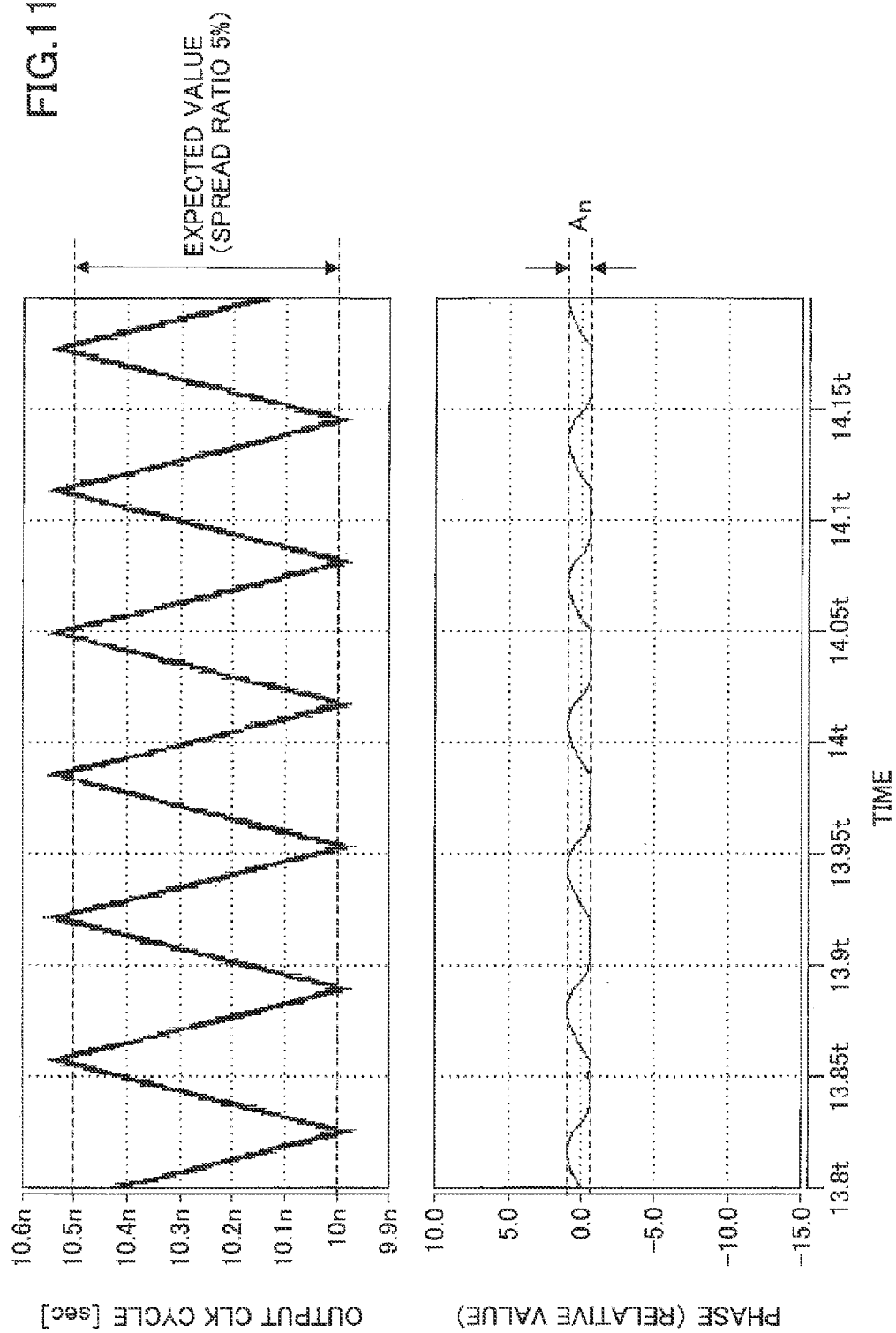
FIG. 11 is a schematic view illustrating an enlarged part of the waveform in FIG. 9 after convergence.

FIGS. 9-11 illustrate an example of simulation result. FIG. 9 illustrates time dependency of the output clock cycle and the phase difference signal PHASE waveform when using the algorithm in FIG. 8, and FIGS. 10-11 illustrate enlarged parts of the waveform in FIG. 9 before and after convergence to the expected value of the gain compensation coefficient, respectively. Simulation conditions are: the input clock frequency=1 MHz; the multiplication number=100, namely, the output clock frequency is about 100 MHz (output clock cycle is about 10 ns); the down-spread method with a triangular wave is used for spectrum spreading; and the target value of the spread ratio=5%. Therefore, the output clock cycle is expected to fluctuate between 10 ns and 10.5 ns with a triangular waveform.

As illustrated in these figures, before convergence, the phase difference signal PHASE has a great amplitude $A_n$ and the output clock cycle is less than the expected value, whereas after convergence, the phase difference signal converges to a small amplitude $A_n$ and the output clock cycle converges to the expected value. Also, the triangular waveform of the output clock cycle has distortion before convergence, which disappears effectively after convergence. Thus, having the algorithm 200 applied, the output clock cycle can be brought to the expected value with the reduction of PHASE amplitude $A_n$ to obtain a triangular waveform without distortion. Here, the PHASE amplitude $A_n$ does not become zero completely in the waveform after convergence illustrated in FIG. 11 due to non-linearity of the DCO.

As above, with the SSCG 100 according to the present embodiment, it is possible to achieve a desired spread ratio by adding spread waves to both of the FCW and the DCO input code, and compensating KDCO so that the triangular wave component of the phase difference signal approaches zero. Also, to detect a residual spread wave in the phase difference signal, the detection/compensation circuit 160 is provided in parallel with the loop filter 130, and the spread frequency can be selected without being restricted by the closed loop function of the PLL circuit. Moreover, the spread frequency may be selected to be a frequency close to the cutoff frequency fc of the closed loop function. Even in a case where fc of the closed loop function of the PLL and the spread frequency are close to each other, a spread spectrum clock is generated that has less distortion (having a flatter electric field peak) under less influence of PLL feedback. Therefore, the SSCG 100 can be used in various circuits including those circuits that require a high spread frequency to suppress EMI of a system including the SSCG.

Here, in FIG. 7, the detection/gain compensation circuit 160 is drawn as if it were separated from the adder 164 and multiplier 162. However, the adder 164 and multiplier 162 may be viewed as a part of the detection/gain compensation circuit 160, and the gain compensation coefficient cor_GAIN in FIG. 7 may be used as an initial value of k in the algorithm illustrated in FIG. 8. Therefore, cor_GAIN in FIG. 7 is not necessarily selected as a required value to compensate the gain KDCO of the DCO, which is different from cor_GAIN illustrated in FIGS. 5-6.

Figure 12:
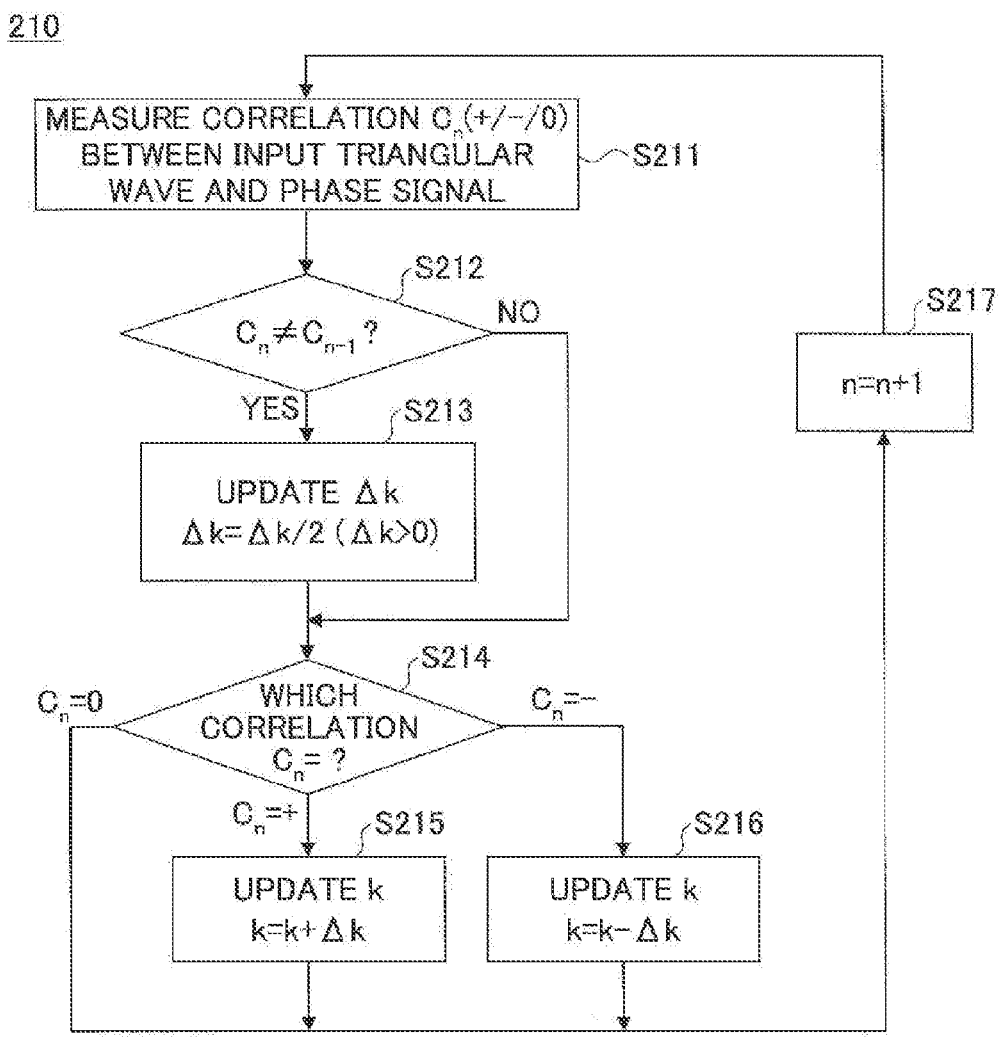
FIG. 12 is a flowchart illustrating another example of a compensation algorithm of a gain compensation coefficient.
Figure 13:
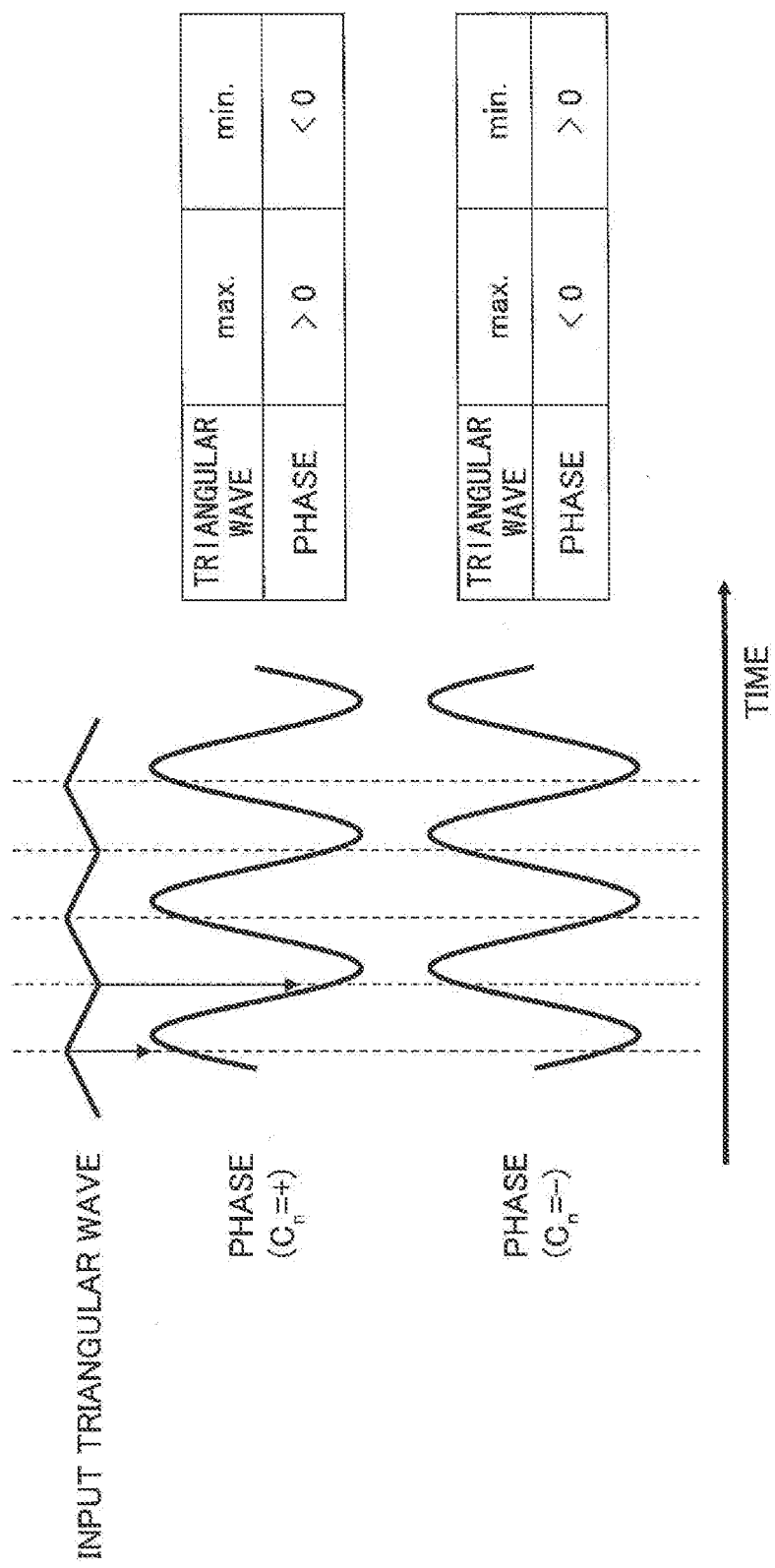
FIG. 13 is a schematic view illustrating a method of measuring a correlation between an input triangular wave and a phase difference signal.

Next, with reference to FIGS. 12-13, another example of the residual spread wave detection/gain compensation algorithm 210 will be described that may be used in the detection/compensation circuit 160.

First, a correlation $C_n$ is measured between the input spread wave from the spread wave generating circuit 150 and the phase difference signal PHASE from the loop filter 130 (n is an integer greater than or equal to 0) (S211). The correlation $C_n$ may be determined, for example, by a phase relationship between the input triangular wave and the phase difference signal. As illustrated in FIG. 13, values of the phase difference signal PHASE are measured at moments when the input triangular wave takes a maximum value and a minimum value, and based on polarities of the phase difference signal at these two moments, the correlation $C_n$ is determined to be one of +, − and 0 (no correlation). Specifically, when the input triangular wave takes a maximum value and a minimum value, it may be determined as a + correlation if the phase difference signal takes plus and minus values, a − correlation if the phase difference signal takes minus or plus values, and a 0 correlation otherwise.

Next, except for n=0, namely, except for the first correlation measurement, it is determined whether the correlation $C_n$ has been changed from the previous correlation $C_{n-1}$ (S212). If changed ("YES" in FIG. 12), an increment $\Delta k$ (>0) of cor_GAIN (denoted as k in FIG. 12) is updated (S213). $\Delta k$ may be updated, for example, by replacing $\Delta k$ with $\Delta k/2$. This replacement may be easily executed with a shift operation of a register that stores the value of $\Delta k$. If it is determined that the correlation has not been changed at Step S212 ("NO" in FIG. 12), for example, $\Delta k$ of cor_GAIN is not updated.

Next, it is determined which correlation +, − or 0, $C_n$ is (S214). If $C_n$=+, the correlation indicates that the current cor_GAIN is less than the expected value, hence the current cor_GAIN is added with $\Delta k$ for compensation (S215). If $C_n$=−, the correlation indicates that the current cor_GAIN is greater than the expected value, hence the current cor_GAIN is subtracted with $\Delta k$ for compensation (S216). If $C_n$=0, the correlation indicates that the current cor_GAIN is close enough to the expected value, hence cor_GAIN is not compensated any further.

After that, the processing with this cor_GAIN is terminated (S217), and after a certain length of wait time, Steps S213 to S217 are iterated. The wait time may be set, for example, to a time which has an iteration frequency of 1/1000 to 1/100 of the input clock frequency $F_{REF}$, which is similar to the wait time at Step S203 in the algorithm 200 above.

This residual spread wave detection/gain compensation algorithm 210, similar to the algorithm 200 above, makes it possible to compensate the gain KDCO of the DCO 140 with high precision to obtain a desired spread ratio. The algorithm 210 also converges faster than the algorithm 200 above because the compensation direction of gain compensation coefficient cor_GAIN is determined by polarities of the input triangular wave and the phase difference signal.

Here, a residual spread wave detection/gain compensation algorithm that can be used in the detect/compensation circuit 160 is not limited to these two algorithms 200 and 210. For example, amplitude measurement (Step S203) in the algorithm 200 and correlation measurement (S211) of the algorithm 210 may be combined to determine the compensation amount $\Delta k$ and compensation direction of cor_GAIN, based on both amplitude $A_n$ and correlation $C_n$. Also, update of the compensation amount $\Delta k$ is not limited to the replacement with $\Delta k/2$, but other update methods may be used, for example, selecting the factor among 4×, 2×, ½ or ¼ depending on the absolute value of the phase difference signal.

Next, with reference to FIGS. 14-16, a modified example of the SSCG 100 illustrated in FIG. 7 will be described.

Figure 14:
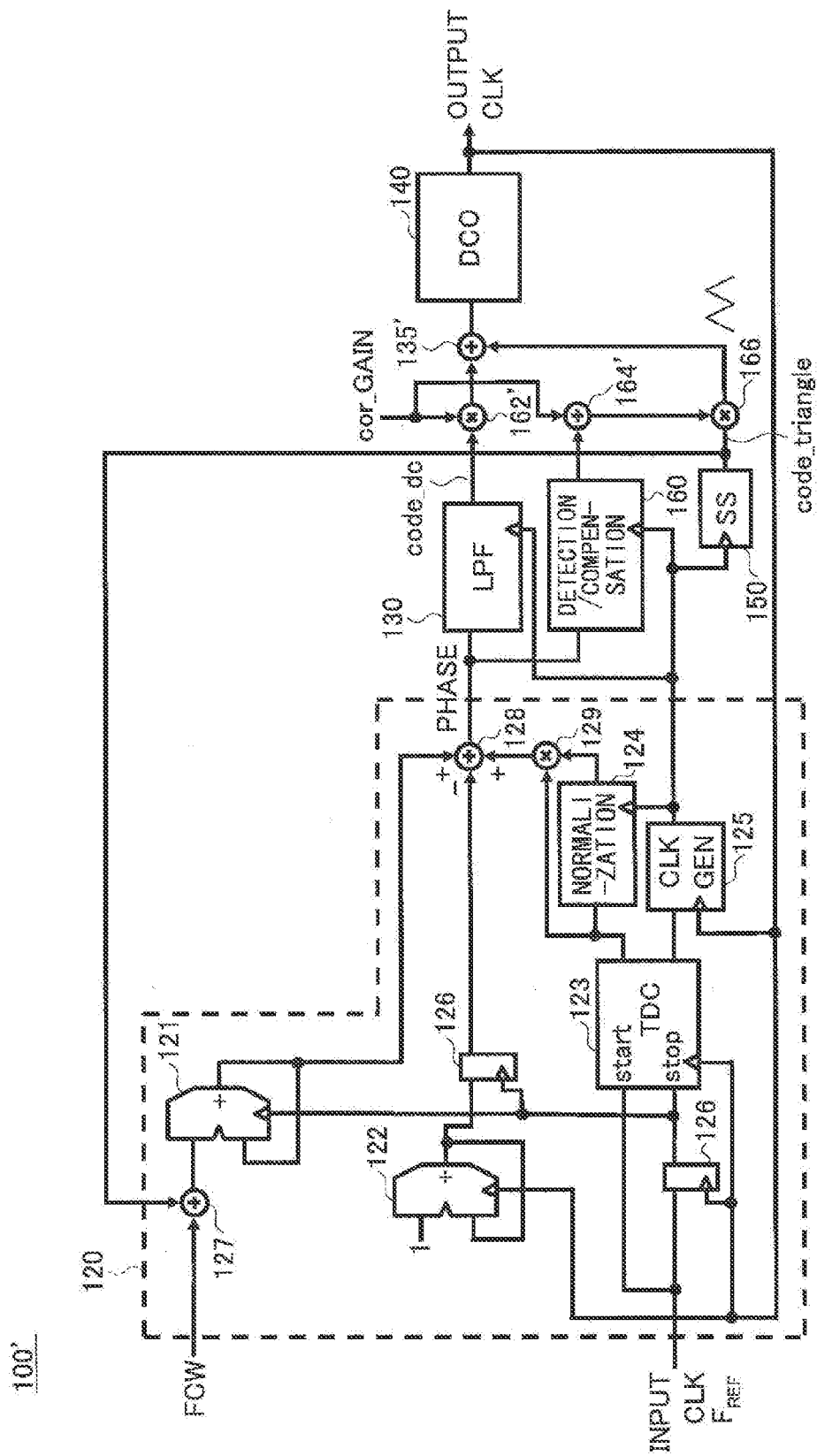
FIG. 14 is a circuit diagram illustrating a modified example of an SSCG according to an embodiment.

Referring to FIG. 14, an SSCG 100' is illustrated according to the modified example. In the SSCG 100 illustrated in FIG. 7, the output of the loop filter 130 added with a triangular wave becomes the input code for the DCO 140, which is multiplied by the gain KDCO compensation coefficient cor_GAIN of the DCO. Therefore, the oscillation frequency of the DCO 140, namely, the output clock frequency $F_{out}$ of the SSCG 100 can be represented as follows:

$$F_{out}=k*KDCO*(code\_dc+code\_triangle) \quad (1)$$

where code_dc and code_triangle are a DC component and a triangular wave component of the input code for the DCO 140, respectively, and k is the gain compensation coefficient corresponding to cor_GAIN. Here, cor_GAIN is denoted as k to indicate that it is a variable coefficient updated by the detection/compensation circuit 160 (for example, following the algorithm illustrated in FIG. 8 or 13). As implied by the formula (1), if k is updated by the detection/compensation circuit 160, the update affects both DC component and triangular wave component. Therefore, in the SSCG 100 illustrated in FIG. 7, it takes time for the DC component to recover the original state with feedback of the PLL circuit.

On the other hand, the SSCG 100' illustrated in FIG. 14 separates gain compensation for a DC component and gain compensation for a triangular wave component. Specifically, the SSCG 100' has adders 135' and 164', and multipliers 162' and 166, instead of the adders 135, 164 and the multiplier 162 in the SSCG 100. A DC component from the loop filter 130 is multiplied by cor_GAIN at the multiplier 162'. A triangular wave component from the spread wave generating circuit 150 is multiplied by cor_GAIN, which has been compensated by the detection/compensation circuit 160 at the adder 164, at the multiplier 166. Then, the DC component and triangular wave component after gain compensation are added with the adder 135' to be input to the DCO 140.

Therefore the oscillation frequency of the DCO 140, namely, the output clock frequency $F_{out}$ of the SSCG 100' can be represented as follows:

$$F_{out}'=cor\_GAIN*KDCO*code\_dc+ \\ k*KDCO*code\_triangle \quad (2)$$

where cor_GAIN multipled by the DC component code_dc is a gain compensation coefficient that takes a predetermined fixed value, and k multiplied to the triangluar wave component code_triangle is a gain compensation coefficient that takes a variable value, as in k for the formaul (1). As implied by the formaul (2), also as illustrated in FIG. 15, an update of k by the detection/compensatio circuit 160 does not affect the DC component. Therefore, with the SSCG 100', the wait time, which has been described with reference to FIGS. 8 and 13, can be shortened after an update of k to make k approach the expected value faster.

Here, in FIG. 14, the detection/gain compensation circuit 160 is drawn as if it were separated from the adder 164' and multiplier 162' and 166. However, these arithmetic units may be viewed as a part of the detection/gain compensation circuit 160. Also, the adder 164' may receive, instead of cor_GAIN, another value as input, for example, a predetermined initial value set in the detection/compensation circuit 160.

Figure 16:
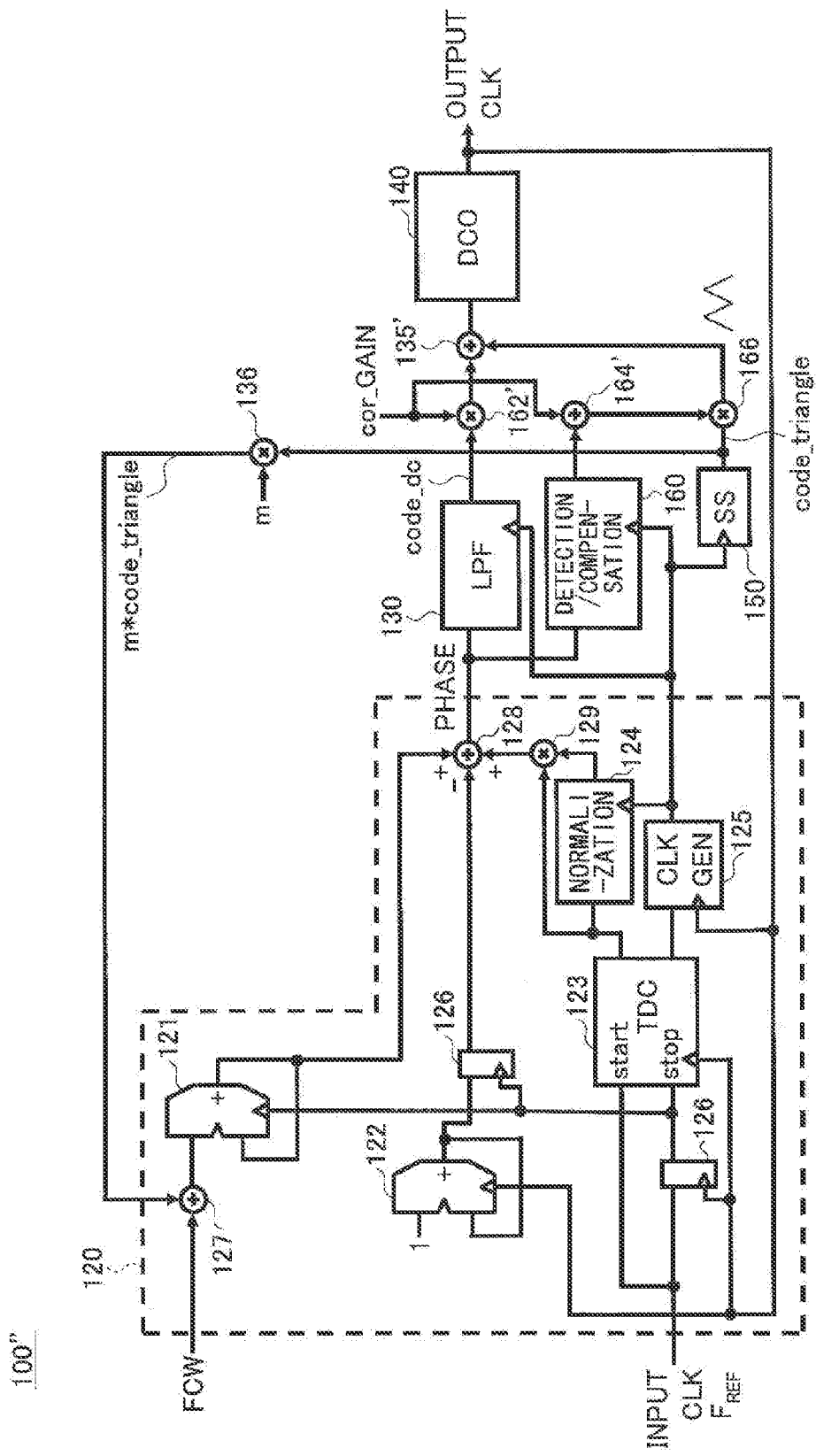
FIG. 16 is a schematic view illustrating another modified example of an SSCG according to an embodiment.

Referring to FIG. 16, an SSCG 100" is illustrated according to another modified example. In addition to the circuit elements of the SSCG 100' illustrated in FIG. 14, the SSCG 100" has a multiplier 136 inserted on a transfer path of the triangular wave from the spread wave generating circuit 150 to the phase comparison circuit 120. The multiplier 136 multiplies the triangular wave code_triangle by m (an arbitrary real number). The SSCG according to the present embodiment, as will be described later, can generate an output clock with a spread spectrum spread by a desired spread ratio even if the phase comparison circuit 120 and DCO 140 are provided with triangular waves that have different sizes from each other, as long as the phases of the triangular waves are aligned.

To compare with the SSCG 100" in FIG. 16, first, cor_GAIN after compensation, namely, the expected value of k (convergence value) in the SSCG 100' in FIG. 15 will be described. In the SSCG 100', as described above, the output clock frequency $F_{out}'$ is represented by the formula (2) above, in which the triangular wave component $F_{out\_triangle}'$ is represented as follows:

$$F_{out\_triangle}' = k \downarrow KDCO * \text{code\_triangle} \quad (3)$$

Also, in the SSCG 100', as triangular wave given to the input of the DCO 140 and the phase comparator 120 are the same, $$F_{out\_triangle}' = F_{REF} * \text{code\_triangle} \quad (4)$$

is satisfied. Here, code_triangle can be denoted as FCW_triangle from the viewpoint of the frequency control word FCW input to the phase comparison circuit (in this case, the fixed-valued frequency control word FCW given to the phase comparison circuit can be denoted as FCW_dc). Therefore, in the SSCG 100', the gain compensation coefficient converges to k that satisfies:

$$k * KDCO = F_{REF} \quad (5)$$

On the other hand, in the SSCG 100" in FIG. 16, although the above formula (3) is satisfied, the phase comparator 120 is supplied with code_triangle multiplied by m, hence instead of the formula (4), $$F_{out\_triangle}' = F_{REF} * m * \text{code\_triangle} \quad (6)$$

is satisfied. Therefore, in the SSCG 100", the gain compensation coefficient converges to k that satisfies:

$$K * KDCO = m * F_{REF} \quad (7)$$

Figure 15:
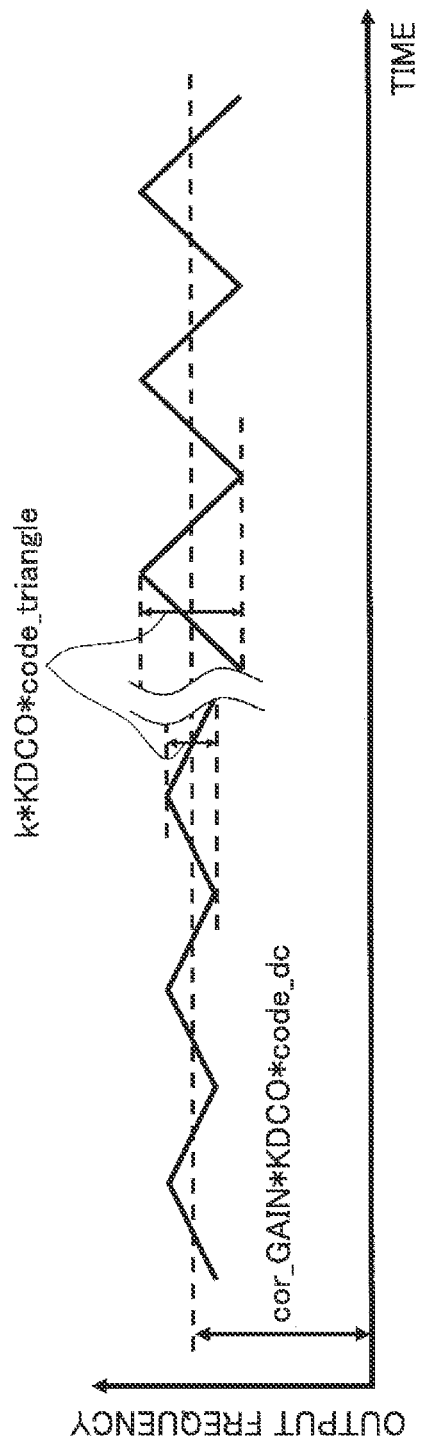
FIG. 15 is a schematic view illustrating an output frequency waveform of the SSCG in FIG. 14.

Namely, it converges to the value that is m times greater than the convergence value in the SSCG 100' in FIG. 15. Here, in the SSCG 100" in FIG. 16, the DC component code_dc of the input code for the DCO 140 is not influenced by the multiplier 136, and the gain compensation coefficient cor_GAIN of the input code is not changed.

Here, although the multiplier 136 is provided on the path of the triangular wave to the phase comparison circuit 120, the multiplier may be provided on the path of the triangular wave from the spread wave generating circuit 150 to the DCO. Also, in the SSCG 100 in FIG. 7, a similar multiplier can be used to provide triangular wave with different sizes from each other, to the phase comparison circuit 120 and the DCO 140.

Figure 17:
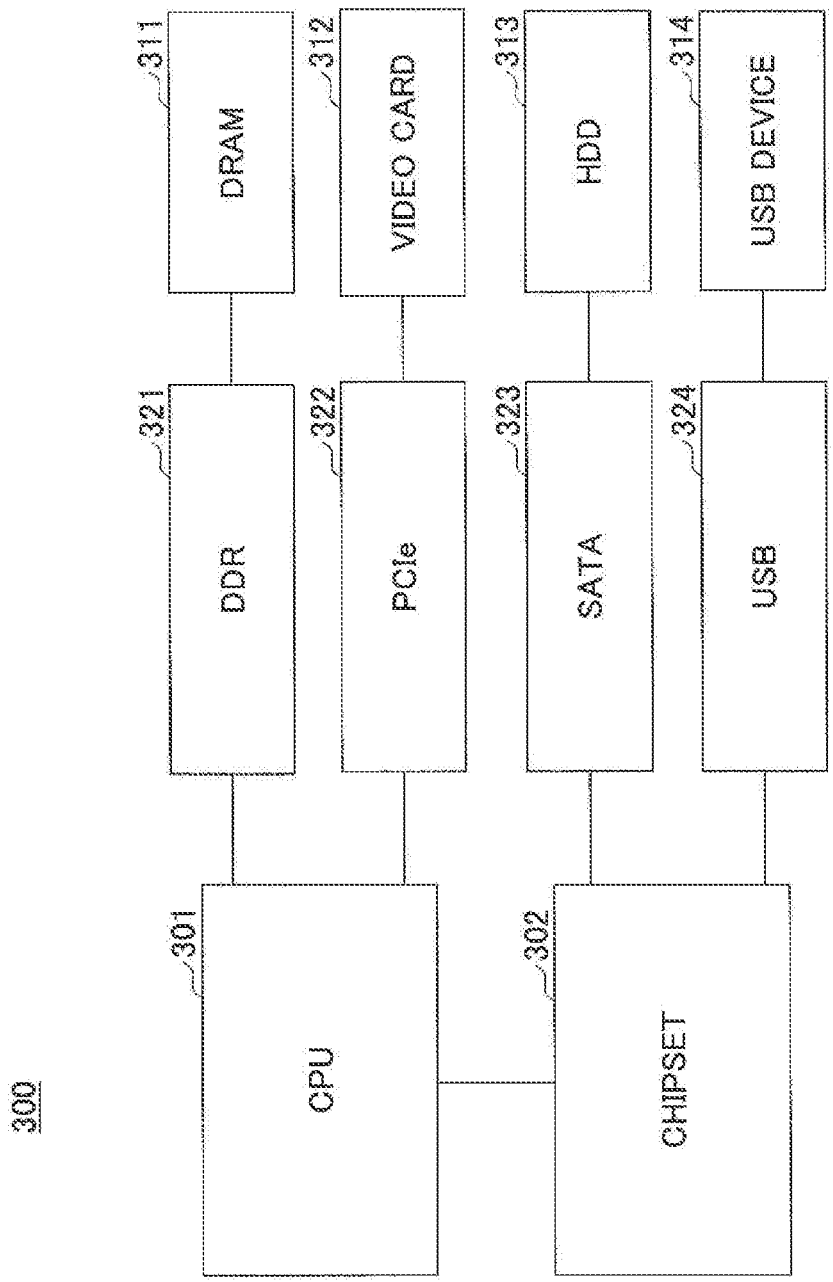
FIG. 17 is a block diagram illustrating an example of a system that may include an SSCG according to an embodiment.

Next, with reference to FIG. 17, an example of a system including SSCGs will be described according to an embodiment. A system 300 illustrated in FIG. 17 is configured with, for example, a computer platform such as a personal computer (PC), which includes one or more processing units. A processing unit may include, for example, one or more processors 301 such as central processing units (CPU). The system 300 may further include one or more chipsets 302 connected with the processor 301. The chipset 302 may include a part of the processing unit of the system 300.

The system 300 has various devices and/or peripheral equipment in its inside, and/or, and can be connected with various types of peripheral equipment outside of the system 300. Therefore, the system 300 is equipped with one or more interfaces (for example, a board having an interface circuit). For example, it may be equipped with a DDR 321 for a DRAM 311, a PCIe (PCI Express) 322 to connect a video card 312 or the like, and an SATA (Serial ATA) 323 for a hard disk drive (HDD) 313. Also, it may be equipped with other interfaces such as USB 324 or the like to connect various USB devices 314. Here, in FIG. 17, although the DDR and the PCIe are connected with the CPU 301, and the SATA and USB are connected with the chipset 302, other connection forms may be used, for example, the chipset 302 may be connected with the DDR.

In the system 300, at least a part of interfaces, for example, the DDR, PCIe and SATA have SSCGs such as the SSCG 100, 100' or 100" according to the above embodiments. Thus, the system 300 can suppress EMI using a clock having a desired spread ratio for data transmission between the processor 301 and/or processing units included in the chipset 302 and the peripheral equipment and/or devices.

Here, in FIG. 17, although a system configured as a computer platform is illustrated, the system according to the present embodiment may not be limited to the compute platform. For example, the above SSCG may be applicable to other systems such as television system including HDMI interface.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A clock generator comprising:
    a digitally controlled oscillator configured to generate an output clock having a frequency depending on an input code;
    a phase comparison section configured to output a phase difference signal by comparing a reference phase with a phase of the output clock, the reference phase being based on an input clock and a predetermined frequency multiplication number;
    a low-pass filter configured to provide the input code for the digitally controlled oscillator by filtering the phase difference signal;
    a waveform generating section configured to generate a predetermined spread spectrum wave, the predetermined spread spectrum wave being to be added with both of the frequency multiplication number and the input code; and
    a detection/compensation section configured to compensate the input code so that a phase difference is reduced, the phase difference being detected from the phase difference signal.

2. The clock generator as claimed in claim 1, wherein the spread spectrum wave is a triangular wave.

3. The clock generator as claimed in claim 1, wherein the spread spectrum wave has a frequency outside of a band of the low-pass filter.

4. The clock generator as claimed in claim 1, wherein the phase comparison section includes
    a first counter configured to determine the reference phase,
    a second counter configured to determine the phase of the output clock, and
    a time-to-digital converter.

5. The clock generator as claimed in claim 1, wherein the detection/compensation section compensates a gain compensation coefficient, the gain compensation coefficient being to be multiplied by the input code of the digitally controlled oscillator so that the phase difference is reduced.

6. The clock generator as claimed in claim 5, wherein the detection/compensation section is configured to compensate the predetermined gain compensation coefficient, and to multiply the input code added with the spread spectrum wave by the compensated gain compensation coefficient.

7. The clock generator as claimed in claim 5, wherein the detection/compensation section is configured to multiply the output from the low-pass filter by the predetermined gain compensation coefficient, and to multiply the spread spectrum wave by the compensated predetermined gain compensation coefficient,
wherein after the compensation is executed by the detection/compensation section, the output from the low-pass filter and the spread spectrum wave are added to be input to the digitally controlled oscillator.

8. The clock generator as claimed in claim 1, wherein the spread spectrum wave generated by the waveform generating section is multiplied by a predetermined constant, then is added with one of the frequency multiplication number and the input code.

9. The clock generator as claimed in claim 5, wherein the detection/compensation section is configured to make the phase difference approach zero by iterating amplitude measurement of the phase difference signal and updating of the gain compensation coefficient in response to a result of the amplitude measurement.

10. The clock generator as claimed in claim 9, wherein the detection/compensation section is configured to maintain an update amount of the gain compensation coefficient if amplitude of the phase difference signal is reduced from the previous iteration, or to multiply the update amount of the gain compensation coefficient by −½ if the amplitude of the phase difference signal is increased from the previous iteration.

11. The clock generator as claimed in claim 9, wherein the amplitude measurement and the update of the gain compensation coefficient are executed at a predetermined iteration frequency, the iteration frequency being set within a range of 1/1000 to 1/100 of the input clock frequency.

12. The clock generator as claimed in claim 5, wherein the detection/compensation section is configured to make the phase difference approach zero by iterating correlation measurement between the spread spectrum wave and the phase difference signal and updating of the gain compensation coefficient in response to a result of the correlation measurement.

13. The clock generator as claimed in claim 12, wherein the correlation is determined based on a polarity of the phase difference signal when the spread spectrum wave takes a maximum value, and a polarity of the phase difference signal when the spread spectrum wave takes a minimum value, the correlation being determined as one of a plus correlation, a minus correlation and no correlation.

14. The clock generator as claimed in claim 13, wherein the updating of the gain compensation coefficient includes to multiply the update amount of the gain compensation coefficient for the previous iteration by ½ if the correlation has not been changed from the previous iteration, and to determine whether to update the gain compensation coefficient depending on the correlation, and an increase/decrease direction of the update.

15. The clock generator as claimed in claim 12, wherein the correlation measurement and the update of the gain compensation coefficient are executed at a predetermined iteration frequency, the iteration frequency being set within a range of 1/1000 to 1/100 of the input clock frequency.

16. A system comprising:
a processor; and
an interface circuit including the clock generator as claimed in claim 1, the interface circuit connecting the processor with a peripheral device.

* * * * *